United States Patent [19]

Ameen et al.

[11] Patent Number: 6,086,743
[45] Date of Patent: Jul. 11, 2000

[54] ADHESION ENHANCEMENT FOR METAL FOIL

[75] Inventors: Thomas J. Ameen, Mentor; Stacy A. Riley, Parma, both of Ohio

[73] Assignee: Gould Electronics, Inc., Eastlake, Ohio

[21] Appl. No.: 09/124,836

[22] Filed: Jul. 30, 1998

Related U.S. Application Data

[63] Continuation-in-part of application No. 08/906,921, Aug. 6, 1997, Pat. No. 5,885,436.

[51] Int. Cl.⁷ ............................. C23C 28/00; C25D 5/34
[52] U.S. Cl. ......................... 205/183; 205/210; 205/215
[58] Field of Search .................................. 205/183, 210, 205/215

[56] References Cited

U.S. PATENT DOCUMENTS

| | | | |
|---|---|---|---|
| 2,754,353 | 7/1956 | Gilliam | 174/120 |
| 4,105,253 | 8/1978 | Showalter | 299/4 |
| 4,358,479 | 11/1982 | Canestaro et al. | 427/98 |
| 4,376,154 | 3/1983 | Nakatsugawa | 428/607 |
| 4,499,152 | 2/1985 | Green et al. | 428/448 |
| 4,642,161 | 2/1987 | Akahoshi et al. | 156/630 |
| 5,061,550 | 10/1991 | Shimizu et al. | 428/209 |
| 5,071,520 | 12/1991 | Lin et al. | 205/155 |
| 5,258,522 | 11/1993 | Tsuchida et al. | 548/110 |
| 5,282,890 | 2/1994 | Protzer et al. | 148/276 |
| 5,338,619 | 8/1994 | Fukuda et al. | 428/623 |
| 5,382,333 | 1/1995 | Ando et al. | 204/130 |
| 5,445,698 | 8/1995 | Takano et al. | 156/307.7 |
| 5,482,784 | 1/1996 | Ohara et al. | 428/607 |
| 5,552,234 | 9/1996 | Kawasumi | 428/633 |
| 5,885,328 | 3/1999 | Markarian et al. | 75/770 |

FOREIGN PATENT DOCUMENTS 4-96293   3/1992   Japan .

*Primary Examiner*—Kathryn Gorgos
*Assistant Examiner*—Edna Wong
*Attorney, Agent, or Firm*—Michael A. Centani

[57] ABSTRACT

In one embodiment, the present invention relates to a method of treating metal foil including sequentially contacting the metal foil with a metal foil oxidizer solution containing water and at least about 7 ppm dissolved oxygen, contacting the metal foil with a chromium containing electrolytic bath and electrolyzing the bath, wherein the bath contains about 0.1 to about 5 g/l of a chromium compound, and contacting the metal foil with a silane solution containing from about 0.1 to about 10% v/v of a silane compound.

20 Claims, No Drawings

ADHESION ENHANCEMENT FOR METAL FOIL

This application is a continuation-in-part of U.S. application Ser. No. 08/906,921, filed Aug. 6, 1997 (now U.S. Pat. No. 5,885,436).

TECHNICAL FIELD

The present invention relates to methods of treating metal foil so as to increase its adhesion to a polymer substrate. In particular, the present invention relates to methods of treating metal foil involving contacting it with a metal foil oxidizing solution, electrolyzing it in a bath containing a chromium compound, and then contacting it with a silane solution.

BACKGROUND OF THE INVENTION

Metal foil, for example copper foil, is often laminated to a dielectric substrate. Resultant laminates are subjected to numerous processing techniques as well as inevitable wear and tear. In this connection, it is desirable to provide a laminate having high peel strength. High peel strength enables a laminate to maintain its structural integrity during processing (exposure to chemicals and various etchants, such as hydrochloric acid) and over the course of normal wear and tear (heat degradation, physical agitation, and so forth).

Metal foils are typically treated to increase surface roughness and thereby increase the peel strength of resultant laminates. However, metal foils having increasingly high levels of surface roughness are subject to "treatment transfer", which is the undesirable migration of metal material from the metal foil to the dielectric substrate. Treatment transfer lowers the peel strength as well as degrading the insulating properties of the dielectric substrate. Treatment transfer also leads to unsightly yellow staining after the metal foil is etched. Accordingly, it is desirable to provide metal foil which not only exhibits high peel strength when incorporated into a laminate, but also does not affect the insulating properties of the dielectric substrate.

When metal foils are treated to increase surface roughness, an electrolytic process is typically utilized. For example, a nodular or dendritic layer of copper or zinc is electrodeposited on metal foil to increase the surface roughness. This process is not only time consuming, but also expensive because of the enormous amount of electricity needed to applying a nodular layer of copper or zinc. Accordingly, it is desirable to increase the efficiency and cost-effectiveness of treating metal foils.

SUMMARY OF THE INVENTION

In one embodiment, the present invention relates to a method of treating metal foil including sequentially contacting the metal foil with a metal foil oxidizer solution containing water and at least about 7 ppm dissolved oxygen, contacting the metal foil with a chromium containing electrolytic bath and electrolyzing the bath, wherein the bath contains about 0.1 to about 5 g/l of a chromium compound; and contacting the metal foil with a silane solution containing from about 0.1 to about 10% v/v of a silane compound.

In another embodiment, the present invention relates to a method of treating metal foil including sequentially immersing the metal foil in a metal foil oxidizer solution containing deionized water and at least about 7.5 ppm dissolved oxygen, optionally rinsing the metal foil, contacting the metal foil with a chromium containing electrolytic bath and electrolyzing the bath, wherein the bath contains about 1 to about 3 g/l of a chromium compound, and immersing the metal foil with a silane solution containing about 0.1 to about 5% v/v of a silane compound.

In yet another embodiment, the present invention relates to a method of enhancing adhesion between copper foil and a dielectric substrate including sequentially contacting the copper foil with a metal foil oxidizer solution comprising water and from about 8 ppm to about 20 ppm dissolved oxygen thereby forming an oxide layer on the copper foil; contacting the metal foil with a chromium containing electrolytic bath and electrolyzing the bath thereby forming a chromium containing layer over the oxide layer, wherein the bath contains about 1 to about 3 g/l of a chromium compound; and contacting the copper foil with a silane solution comprising about 0.1 to about 5% v/v of a silane compound thereby forming a silane containing layer over the chromium containing layer, with the proviso that the copper foil is not contacted with a reducing agent after contact with the first solution.

As a result of the present invention, it is possible to provide metal foil which exhibits high peel strength due, in part, to its ability to maintain structural integrity during processing. The present invention also provides metal foil which exhibits little or no treatment transfer when incorporated into a laminate.

DESCRIPTION OF THE INVENTION

The metal foil used with this invention is preferably an electrically conductive foil with copper and copper-based alloy foils being especially preferred. Other examples include aluminum, nickel, tin, silver, gold and alloys thereof. The metal foils are made using one of two techniques. Wrought or rolled metal foil is produced by mechanically reducing the thickness of a copper or copper alloy strip or ingot by a process such as rolling. Electrodeposited foil is produced by electrolytically depositing metal ions, such as copper ions, on a rotating cathode drum and then peeling the deposited strip from the cathode. Electrodeposited copper foils are especially preferred.

The metal foils typically have nominal thicknesses ranging from about 0.0002 inch to about 0.02 inch. Metal foil thickness is sometimes expressed in terms weight and typically the foils of the present invention have weights or thicknesses ranging from about $\frac{1}{8}$ to about 14 oz/ft$^2$. Especially useful metal foils are those having weights of $\frac{1}{2}$, 1 or 2 oz/ft$^2$, and in particular, copper foil having weights of $\frac{1}{2}$, 1 or 2 oz/ft$^2$.

Electrodeposited metal foils have a smooth or shiny (drum) side and a rough or matte (metal deposit growth front) side. The side or sides of the metal foil (electrodeposited or wrought) which may be treated in accordance with the invention can be the rough or matte side, shiny side, or both sides. The sides may be a "standard-profile surface," "low-profile surface" or "very-low-profile surface." Especially preferred embodiments involve the use of foils with matte surfaces and standard-profile surfaces. The term "standard-profile surface" is used herein to refer to a foil surface having an $R_{tm}$ of about 7 microns to about 12 microns. The term "low-profile surface" refers to a foil surface having an $R_{tm}$ of about 7 microns or less. The term "very-low-profile surface" refers to a foil surface having an $R_{tm}$ of about 4 microns or less. $R_{tm}$ is the mean of the maximum peak-to-valley vertical measurement from each of five consecutive sampling measurements, and can be measured using a SURTRONIC® 3 profilometer marketed by Rank Taylor Hobson, Ltd., Leicester, England.

In one embodiment, the metal foils of the present invention may be characterized by the absence of any added metal layer containing zinc. This includes layers of zinc as well as layers of metal alloys containing zinc. In some instances, zinc deleteriously interferes with the metal foil oxidizer solution resulting in a treated metal foil having poor properties.

In one embodiment, the metal foils of the present invention may be characterized by the absence of any added surface roughening treatment on the base surface of the side or sides on which the inventive method is practiced. The term "base surface" of a side of foil refers to a raw foil surface which has not been subjected to any subsequent treatments of the type discussed below for refining or enhancing foil properties and/or increasing surface roughness. The term "added surface roughening" refers to any treatment performed on the base surface of the foil for the purpose of increasing the roughness of the surface of the foil not in accordance with the inventive method. In one embodiment, added surface roughening increases the $R_{tm}$ by 3 microns or more; and in another embodiment, added surface roughening increases the $R_{tm}$ by 10 microns or more.

In one embodiment, metal treatments such as copper treatments that add surface roughness are excluded from the inventive methods. Metal treatments include copper or zinc deposited electrolytically in nodular or dendritic form, and copper oxide which grows in nodular or dendritic form on the base surface of the foil. Metal foil having a naturally occurring relatively rough layer (saw-tooth shape) on the matte side of its base surface is not excluded from being within the scope of the present invention.

In one embodiment, mechanical roughness imparted to wrought metal foil during rolling or by subsequent abrasion which increases roughness beyond that of a standard profile surface is considered to be an added surface roughening treatment and is therefore excluded in accordance with the invention. In one embodiment, roughness imparted to an electrodeposited metal foil during electrodeposition which increases roughness beyond that of a standard profile surface is considered to be an added surface roughening. In one embodiment, any roughness imparted to the base surface of a metal foil that increases the roughness of said foil beyond that of a standard profile surface is considered to be added surface roughening. In one embodiment, any roughness imparted to the base surface of a metal foil that increases the roughness of said foil beyond that of a low-profile surface is considered to be added surface roughening. In one embodiment, any roughness imparted to the base surface of a metal foil that increases the roughness of said foil beyond that of a very low-profile surface is considered to be added surface roughening.

In one embodiment, the base surface of the side or sides of the metal foil is untreated prior to being subjected to the inventive method. The term "untreated" is used herein to refer to the base surface of a metal foil that has not undergone subsequent treatment for the purpose of refining or enhancing the foil properties and/or increasing surface roughness. In one embodiment, the untreated foils have a naturally occurring, non-dendritic or non-nodular layer of copper oxide or another metal or metal alloy adhered to the base surface thereof. The naturally occurring non-dendritic layer is not an added metal treatment.

In one embodiment, the base surface of the side or sides of the foil is treated, prior to being subjected to the inventive method, with one or more surface treatment layers for the purpose of refining or enhancing the foil properties, but not to add surface roughness. Any side of the foil which is not subjected to the inventive method can, optionally, also have one or more of such treatment layers applied to it. These surface treatments are known in the art.

For example, the surface treatments include the application of a metal layer which does not increase the surface roughness wherein the metal is indium, tin, nickel, cobalt, copper alloy such as copper-tin alloy, and mixtures of two or more thereof, prior to practicing the inventive method. Metal layers of this type are sometimes referred to as barrier layers. These metal layers preferably have thicknesses in the range of about 0.01 to about 1 micron, more preferably about 0.05 to about 0.1 micron.

The surface treatments also include the application of a metal layer which does not increase the surface roughness wherein the metal is tin, nickel, molybdenum, aluminum, or a mixture of two or more thereof, prior to practicing the inventive method. Metal layers of this type are sometimes referred to as stabilization layers. These stabilization layers can be applied to the base surface of the foil, or they can be applied to a previously applied barrier layer. These stabilization layers preferably have thicknesses in the range of about 0.005 to about 0.05 micron, more preferably about 0.01 to about 0.02 micron.

In one embodiment, one or both sides of the foil are first treated with at least one barrier layer. In another embodiment, one or both sides of the foil are first treated with at least one stabilization layer. In yet another embodiment, one or both sides of the foil are first treated with at least one barrier layer, then at least one of the treated sides is treated with at least one stabilization layer prior to practicing the inventive method.

The metal foil in accordance with this invention can be a single layer metal foil, such as a copper foil, an aluminum foil or a nickel foil, or a foil of a metal alloy. The metal foil in accordance with this invention can be a foil containing multiple layers of a metal or metal alloy, such as a foil made of layers of copper and brass. There is no particular limit to the number of metal layers in any given metal foil.

The inventive method involves sequentially performing at least three steps. First, a metal foil is contacted with a metal foil oxidizer solution. The metal foil is subsequently contacted with a chromium containing electrolytic bath and electrolyzed. Afterwards, the metal foil is contacted with a silane solution. The term "sequentially" means that the three steps are performed in the order listed. That is, contact with the chromium containing electrolytic bath must be performed after contacting the metal foil with a metal foil oxidizer solution and before contact with a silane solution. However, the three steps do not necessarily have to be performed immediately after each other as additional steps may be practiced. For instance, a rinsing step may be performed after a metal foil is contacted with the metal foil oxidizer solution but before the metal foil is contacted with the chromium containing electrolytic bath. Thus, the term "sequentially" refers to the three essential steps of the inventive method, not to any additional steps in various embodiments of the inventive method.

In one embodiment, the inventive process involves contacting the metal foil with an acidic solution. An acidic solution has a pH of less than about 5, and preferably less than about 3, and more preferably less than about 2. The acidic solution contains an acid and a solvent such as water, polar organic liquids such as alcohols and glycols, and mixtures thereof.

Contacting the metal foil with the acidic solution serves to remove surface oxides from the metal foil and otherwise clean the surface of the metal foil. Additionally, contact with the acidic solution facilitates subsequent treatment steps.

The metal foil is contacted with the acidic solution via any conventional means including but not limited to dipping, spraying, wiping, immersing and the like. In a preferred embodiment, the metal foil is immersed in the acidic solution. In another preferred embodiment, the temperature of the acidic solution is from about 20° C. to about 60° C., and more preferably from about 30° C. to about 40° C.

The acidic solution contains an acid and a suitable solvent, which is typically water, although polar organic liquids can be used, or combinations of water and polar organics. Either inorganic or organic acids can be used, but inorganic acids are preferred. Specific examples of inorganic acids which may be utilized in the acidic solution include halogen acids such as hydrofluoric acid, hydrochloric acid, hydrobromic acid and hydriodic acid, sulfuric acid, sulfurous acid, nitric acid, perchloric acid, boric acid and phosphorus acids such as phosphorous acid and phosphoric acid, and combinations thereof. Nitric acid and sulfuric acid are preferred inorganic acids. Examples of organic acids include carboxylic and polycarboxylic acids such as formic acid, acetic acid, propionic acid, citric acid, oxalic acid, etc.; organic phosphorus acids such as dimethylphosphoric acid and dimethylphosphinic acid; or sulfonic acids such as methanesulfonic acid, ethanesulfonic acid, 1-pentanesulfonic acid, 1-hexanesulfonic acid, 1-heptanesulfonic acid, benzenesulfonic acid, toluenesulfonic acid, etc, and combinations thereof.

In a preferred embodiment, after the metal foil has contacted the acidic solution, the metal foil is optionally rinsed with a neutral solution, and in most instances water, and preferably deionized water. The rinsing solution does not contain elevated levels of dissolved oxygen. The neutralizing or rinsing solution serves to remove excess acid from the surface of the metal foil in addition to neutralizing the surface of the metal foil.

The metal foil is contacted with a metal foil oxidizer solution. The metal foil is contacted with the solution via any conventional means including dipping, spraying, wiping, immersing and the like, although immersing the metal foil in the solution is preferred. Application of an electrical current is not required. In one embodiment, the temperature of the metal foil oxidizer solution is from about 2° C. to about 50° C. In another embodiment, the temperature of the metal foil oxidizer solution is from about 10° C. to about 40° C. In yet another embodiment, the temperature of the metal foil oxidizer solution is from about 15° C. to about 30° C. In one embodiment, the metal foil is contacted with the metal foil oxidizer solution from about 1 to about 100 seconds. In another embodiment, the metal foil is contacted with the metal foil oxidizer solution from about 2 to about 50 seconds. In yet another embodiment, the metal foil is contacted with the metal foil oxidizer solution from about 5 to about 25 seconds.

The metal foil oxidizer solution contains water having a sufficient amount of dissolved oxygen therein to oxidize the surface of the metal foil. In a preferred embodiment, the water is deionized water, although tap water may be used. The water of the metal foil oxidizer solution contains at least about 7 ppm dissolved oxygen. In a preferred embodiment, the water of the metal foil oxidizer solution contains at least about 7.5 ppm dissolved oxygen. In one embodiment, the water contains from about 8 ppm to about 20 ppm dissolved oxygen. In another embodiment, the water contains from about 9 ppm to about 15 ppm. Water containing the specified levels of dissolved oxygen may be obtained by acquiring water with relatively high levels of dissolved oxygen or aerating water with pure oxygen gas or a gas containing oxygen until the desired dissolved oxygen level is reached. Gases containing oxygen include air and mixtures of oxygen and one or more of inert and nonreactive gases such as hydrogen, nitrogen, helium, neon, argon, krypton and xenon. During the inventive process, the metal foil oxidizer solution may be periodically or continually aerated to maintain a desired minimum level or range of dissolved oxygen.

The oxygen level of the metal foil oxidizer solution may be periodically or continually measured using any known means to measure dissolved oxygen content. For example, one apparatus is under the trade designation YSI Model 57 Series Dissolved Oxygen Meter from Yellow Springs Instrument Company. Reagent methods, based on the Winkler method, may also be employed. Dissolved oxygen reagent sets, using buret titration methods, digital titrator methods, or drop count titration methods, dissolved oxygen reagent AccuVac® ampuls, and Pocket Colorimeter™ for dissolved oxygen are available from Hach Company.

In one embodiment, the metal foil oxidizer solution is metal free; that is, the metal foil oxidizer solution is characterized by the absence of added metals or metal compounds. Trace amounts of metals or metal compounds in tap water and deionized water may be tolerated. In another embodiment, the metal foil oxidizer solution is free of organic solvents; that is, the metal foil oxidizer solution is characterized by the absence of added organic solvents. In yet another embodiment, small amounts (less than about 2% by weight or less than about 1% by weight) of organic solvents may be present in the tap or deionized.

The oxide layer formed due to contact of the metal foil with the metal foil oxidizer solution is very thin. In another embodiment, the oxide layer has a thickness from about 1 to about 25 Å, but less than about 25 Å. In another embodiment, the thickness of the resultant oxide layer on the metal foil is from about 2 to about 20 Å, but less than about 20 Å. In another embodiment, the thickness of the resultant oxide layer on the metal foil is from about 3 to about 15 Å, but less than about 15 Å.

The metal foil oxidizer solution containing water and at least 7 ppm dissolved oxygen leads to the formation of a relatively thin oxide layer on the metal foil. As a result of the specific amount of dissolved oxygen present in the solution, the quality of the oxide layer is increased. This is due, in part, to the prevention of the formation of a needle-like black oxide layer since the metal foil oxidizer solution is not an aggressive oxidizer. As a result, increased peel strengths are obtainable in laminates containing metal foil treated in accordance with the invention without electrolytically treating the metal foil.

After the metal foil has contacted the metal foil oxidizer solution, the metal foil is not contacted with a reducing agent. Reducing agents deleteriously affect the surface of the metal foil which has contacted an oxidizing solution. As a result of the absence of contact with a reducing agent, increased peel strengths are obtainable in laminates containing metal foil treated in accordance with the invention. Reducing agents include formaldehyde, hypophosphites, hydrazine, and amine boranes. Reducing agents also include reducing gases such as those derived from catalytic pyrolysis of lower alcohols, aldehydes, lower carboxylic acids and esters thereof, ammonia, hydrozine, nitrogen containing lower amines, metal hydrides and boron compounds. Catalytic pyrolysis involves generating hydrogen or carbon monoxide gas.

In one embodiment, after the metal foil has contacted the metal foil oxidizing solution, the metal foil is optionally rinsed with a neutral solution, and in most instances water and specifically deionized water. The rinsing solution does not contain elevated levels of dissolved oxygen. The neutralizing or rinsing solution serves to remove excess oxidizers and/or oxygen from the surface of the metal foil.

After the metal foil has contacted the metal foil oxidizing solution and optionally has been rinsed, the metal foil is placed in a chromium containing electrolytic bath. The chromium containing electrolytic bath is an aqueous solution containing a chromium compound and optionally performance enhancing additives. A current is applied to the bath so that a cathodic chrome layer is electrolytically deposited on the metal foil. The chromium compound is any compound capable of depositing a thin layer of cathodic chrome or chromium onto the metal foil. Examples of chromium compounds include chromium oxide such as chromium trioxide, chromium anhydride, chromic acid, hexavalent chromium compounds, dichromates such as potassium dichromate and sodium dichromate, and chromates such as potassium chromate, sodium chromate and magnesium chromate. The chromium compound is present in the chromium containing electrolytic bath in an amount from about 0.1 to about 5 g/l, and preferably from about 1 to about 3 g/l.

Optional performance enhancing additives include zinc compounds, such as zinc salts (for example, zinc acetate, zinc chloride, zinc cyanide, zinc nitrate and zinc sulfate), and phosphorus compounds such as phosphoric acid, phosphorus acid, polyphosphoric acids, pyrophosphoric acid, phosphate salts, pyrophosphate salts and polyphosphate salts.

In one embodiment, the temperature of the chrome containing electrolytic bath during the electrodeposition step is from about 15° C. to about 30° C., and preferably from about 20° C. to about 25° C. The pH of the chromium containing electrolytic bath depends upon the identity of the particular chromium compound of a specific embodiment, and thus is not critical. In one embodiment, the current density applied to the chromium containing electrolytic bath is from about 5 to about 40 ASF. In another embodiment, the current density is from about 10 to about 30 ASF, and more preferably from about 12 to about 25 ASF. The metal foil is placed in the chromium containing electrolytic bath for a time sufficient to permit the formation of a relatively thin but uniform cathodic chrome layer over the metal foil oxidizer treated metal foil surface. In one embodiment, the metal foil is placed in the chromium containing electrolytic bath from about 1 to about 20 seconds, and more preferably from about 2 to about 10 seconds.

In one embodiment, the thickness of the resultant cathodic chrome layer is from about 25 to about 125 Å. In a preferred embodiment, the thickness of the resultant cathodic chrome layer is from about 50 to about 100 Å. The thickness of the cathodic chrome layer is substantially uniform over the entire surface of the metal foil and follows any contours on the surface of the metal foil.

In a preferred embodiment, after the metal foil has contacted the chromium containing electrolytic bath, the metal foil is optionally rinsed with a neutral solution, and in most instances water and specifically deionized water. The rinsing solution does not contain elevated levels of dissolved oxygen. The neutralizing or rinsing solution serves to remove excess bath solution from the surface of the metal foil.

After the metal foil has contacted the metal foil oxidizing solution and the chromium containing electrolytic bath, the metal foil is contacted with a solution containing a silane compound in a suitable solvent. The silane compound is present in the solution in an amount from about 0.1 to about 10% v/v, and preferably from about 0.2 to about 5% v/v, and more preferably from about 0.3 to about 3% v/v. Preferred silane compounds are silane coupling agents. Preferred silane coupling agents are amino-silane compounds, epoxy-silane compounds, and alkoxy-silane compounds.

In one embodiment, the silane compound may be represented by the formula

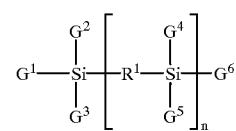

wherein $G^1$, $G^2$, $G^3$, $G^4$, $G^5$ and $G^6$ are independently halogen, hydrocarbyloxy, or hydroxy groups; $R^1$ is a hydrocarbon group or nitrogen-containing hydrocarbon group; and n is zero or 1. In one embodiment each of $G^1$, $G^2$, $G^3$, $G^4$, $G^5$ and $G^6$ is independently chloro, alkoxy, alkoxyalkoxy or alkoxyalkoxyalkoxy, and $R^1$ is an alkylene or an arene group of up to about 10 carbon atoms, or a monoamino- or polyamino-substituted alkylene or arene group of up to about 10 carbon atoms. In one embodiment each of $G^1$, $G^2$, $G^3$ and $G^6$ is an alkoxy, alkylalkoxy, alkoxyalkoxy or alkoxyalkoxyalkoxy group of up to about 10 carbon atoms, and n is zero.

Examples of these silane compounds include tetramethoxysilane, tetraethoxysilane, tetrapropoxysilane, tetra-n-butoxysilane, tetrakis(2-ethoxyethoxy)silane, tetrakis(2-ethylbutoxy)silane, tetrakis(2-ethylhexoxy)silane, tetrakis(methoxyethoxyethoxy)silane, tetrakis(2-methoxyethoxy)silane, tetrakis(1-methoxy-2-propoxy) silane, bis[3-(triethoxysilyl)propyl]amine, bis[3-(trimethoxysilyl)propyl]ethylenediamine, 1,2-bis (trimethoxysilyl)ethane, bis(trimethoxysilylethyl)benzene, 1,6-bis(trimethoxysilyl)hexane, 1,2-bis(trichlorosilyl) ethane, 1,6-bis(trichlorosilyl)hexane, and 1,8-bis (trichlorosilyl)octane.

In another embodiment, the silane compound may be a compound represented by the formula

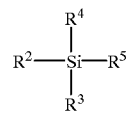

wherein $R^2$, $R^3$, $R^4$ and $R^5$ are independently hydrogen, a halogen group, a hydrocarbyloxy group, a hydroxy group, an organofunctional group, the organofunctional group being reactive with or having an affinity for another substrate (such as a prepreg). Examples of organofunctional groups include amino-containing, hydroxy-containing, alkoxy-containing hydrocarbon group, alkene-containing hydrocarbons, aromatics, heterocyclics, and epoxy-containing groups. In one embodiment, each of $R^3$, $R^4$ and $R^5$ are chloro, methoxy or ethoxy, and $R^2$ is an organofunctional group. In one embodiment, each of $R^4$ and $R^5$ are chloro, methoxy or ethoxy, and $R^2$ and $R^3$ are an organofunctional groups.

Examples of these silane compounds include tetramethoxysilane; tetraethoxysilane; diaminosilane; N-(2-aminoethyl)-3-aminopropyltrimethoxysilane; 3-(N-styrylmethyl-2-aminoethylamino)propyltrimethoxysilane; 3-aminopropyltriethoxy silane; bis(2-hydroxyethyl)-3-aminopropyltriethoxysilane; β-(3,4-epoxycyclohexyl) ethyltrimethoxysilane; 3-glycidoxypropyltrimethoxysilane; 3-methacryloxypropyltrimethoxysilane; 3-chloropropyltrimethoxysilane; vinyltrichlorosilane; vinyltriethoxysilane; vinyl-tris(2-methoxyethoxy)silane; aminopropyltrimethoxysilane; N-methylaminopropyltrimethoxysilane; N-phenylaminopropyltrimethoxysilane; 3-acetoxypropyltrimethoxysilane; N-(3-acryloxy-2-hydroxypropyl)-3-aminopropyltriethoxysilane; 3-acryloxypropyltrimethoxysilane; allyltriethoxysilane; allyltrimethoxysilane; 4-aminobutyltriethoxysilane; (aminoethylaminomethyl)phenethyltrimethoxysilane; N-(2-aminoethyl-3-aminopropyl)trimethoxysilane; N-(2-aminoethyl-3-aminopropyl)tris(2-ethylhexoxy)silane; 6-(aminohexylaminopropyl)trimethoxysilane; aminophenyltrimethoxysilane; 3-(1-aminopropoxy)-3,3-dimethyl-1-propenyltrimethoxysilane; 3-aminopropyltris(methoxyethoxyethoxy)silane; 3-aminopropyltriethoxysilane; 3-aminopropyltrimethoxysilane; ω-aminoundecyltrimethoxysilane; 3-[2-N-benzylaminoethylaminopropyl]trimethoxysilane; bis(2-hydroxyethyl)-3-aminopropyltriethoxysilane; 8-bromooctyltrimethoxysilane; bromophenyltrimethoxysilane; 3-bromopropyltrimethoxysilane; 2-chloroethyltriethoxysilane; p-(chloromethyl)phenyltrimethoxysilane; chloromethyltriethoxysilane; chlorophenyltriethoxysilane; 3-chloropropyltriethoxysilane; 3-chloropropyltrimethoxysilane; 2-(4-chlorosulfonylphenyl)ethyltrimethoxysilane; 3-(cyanoethoxy)-3,3-dimethyl-1-propenyltrimethoxysilane; 2-cyanoethyltriethoxysilane; 2-cyanoethyltrimethoxysilane; (cyanomethylphenethyl)trimethoxysilane; 3-cyanopropyltriethoxysilane; 3-cyclopentadienylpropyltriethoxysilane; (N,N-diethyl-3-aminopropyl)trimethoxysilane; diethylphosphatoethyltriethoxysilane; (N,N-dimethyl-3-aminopropyl)trimethoxysilane; 2-(diphenylphosphino)ethyltriethoxysilane; 2-(3,4-epoxycyclohexyl)ethyltrimethoxysilane; 3-iodopropyltrimethoxysilane; 3-isocyanatopropyltriethoxysilane; 3-mercaptopropyltriethoxysilane; 3-mercaptopropyltrimethoxysilane; methacryloxypropenyltrimethoxysilane; 3-methacryloxypropyltrimethoxysilane; 3-methacryloxypropyltris(methoxyethoxy)silane; 3-methoxypropyltrimethoxysilane; N-methylaminopropyltrimethoxysilane; O-4-methylcoumarinyl-N-[3-(triethoxysilyl)propyl]carbamate; 7-oct-1-enyltrimethoxysilane; N-phenethyl-N'-triethoxysilylpropylourea; N-phenylaminopropyltrimethoxysilane; 3-(N-styrylmethyl-2-aminoethylamino)propyltrimethoxysilane; 3-thiocyanatopropyltriethoxysilane; N-(3-triethoxysilylpropyl)acetylglycinamide; N-(triethoxysilylpropyl)dansylamide; N-[3-(triethoxysilyl)propyl]-2,4-dinitrophenylamine; triethoxysilylpropylethylcarbamate; N-[3-(triethoxysilyl)propyl]-4,5-dihydroimidazole; N-triethoxysilylpropyl-o-menthocarbamate; 3-(triethoxysilylpropyl)-p-nitrobenzamide; N-[3-(triethoxysilyl)propyl]phthalamic acid; N-(triethoxysilylpropyl)urea; 1-trimethoxysilyl-2-(p,m-chloromethyl)phenylethane; 2-(trimethoxysilyl)ethylphenylsulfonylazide; β-trimethoxysilylethyl-2-pyridine; trimethoxysilyloctyltrimethylammonium bromide; trimethoxysilylpropylcinnamate; N(3-trimethoxysilylpropyl)-N-methyl-N,N-diallylammonium chloride; trimethoxysilylpropyldiethylenetriamine; N-[(3-trimethoxysilyl)propyl]ethylenediaminetriacetic acid trisodium salt; trimethoxysilylpropylisothiouronium chloride; N-(3-trimethoxysilylpropyl)pyrrole; N-trimethoxysilylpropyltri-N-butylammonium bromide; N-trimethoxysilylpropyl-N,N,N-trimethylammonium chloride; vinyltriethoxysilane; vinyltriisopropoxysilane; vinyltrimethoxysilane; vinyltris-t-butoxysilane; vinyltris(2-methoxyethoxy)silane; vinyltriisopropenoxysilane; vinyltris (t-butylperoxy)silane; 2-acetoxyethyltrichlorosilane; 3-acryloxypropyltrichlorosilane; allyltrichlorosilane; 8-bromooctyltrichlorosilane; bromophenyltrichlorosilane; 3-bromopropyltrichlorosilane; 2-(carbomethoxy)ethyltrichlorosilane; 1-chloroethyltrichlorosilane; 2-chloroethyltrichlorosilane; p-(chloromethyl)phenyltrichlorosilane; chloromethyltrichlorosilane; chlorophenyltrichlorosilane; 3-chloropropyltrichlorosilane; 2-(4-chlorosulfonylphenyl)ethyltrichlorosilane; (3-cyanobutyl)trichlorosilane; 2-cyanoethyltrichlorosilane; 3-cyanopropyltrichlorosilane; (dichloromethyl)trichlorosilane; (dichlorophenyl)trichlorosilane; 6-hex-1-enyltrichloro silane; 3-methacryloxypropyltrichlorosilane; 3-(4-methoxyphenyl)propyltrichlorosilane; 7-oct-1-enyltrichlorosilane; 3-(N-phthalimido)propyltrichlorosilane; 1-trichlorosilyl-2-(p,m-chloromethylphenyl)ethane; 4-[2-(trichlorosilyl)ethyl] cyclohexene; 2-[2-(trichlorosilyl)ethyl]pyridine; 4-[2-(trichlorosilyl)ethyl]pyridine; 3-(trichlorosilyl)propylchloroformate; and vinyltrichlorosilane.

Mixtures of two or more of the silane compounds listed above may be used. For example, in one embodiment, the silane compound is N-(2-amino-ethyl-3-aminopropyl) trimethoxysilane, 3-aminopropyltrimethoxysilane or 3-glycidoxypropyltrimethoxysilane in combination with tetraethoxysilane or tetramethoxysilane.

The silane solution may be in the form of a dispersion or solution in water, a mixture of water and alcohol, or a suitable organic solvent, or as an aqueous emulsion of the silane mixture, or as an aqueous emulsion of a solution of the silane compound in a suitable organic solvent. Conventional organic solvents may be used. These include alcohols, ethers, ketones, and mixtures of these with aliphatic or aromatic hydrocarbons or with amides such as N,N-dimethylformamide. Useful solvents are those having good wetting and drying properties and include, for example, water, ethanol, isopropanol, and methylethylketone. Aqueous emulsions of the silane compound may be formed in conventional manner using conventional dispersants and surfactants, including nonionic dispersants. The step of contacting the metal foil with the silane solution may be repeated, if desired, several times. However, a single step gives generally useful results and, hence, the use of a single step is generally preferred. Contact is accomplished via known application methods which include reverse roller coating, doctor blade coating, dipping, immersing, painting and spraying.

The silane solution is typically at a temperature of preferably about 15° C. to about 45° C., more preferably about 20° C. to about 30° C. After the metal foil is treated with the silane solution, the metal foil can be heated to a temperature of preferably about 60° C. to about 170° C., more preferably about 90 to 150° C., for preferably about 0.03 to about 5 minutes, more preferably about 0.2 to about 2 minutes to enhance drying of the surface. The dry film thickness of the silane compound on the metal foil is preferably from about 0.002 to about 0.1 microns, more preferably about 0.005 to about 0.02 microns.

In one embodiment, after the metal foil is treated in accordance with the invention, no electrolytic step is performed. In another embodiment, other than the electrolyzing step involving a chromium containing electrolytic bath, no electrolytic step is performed. The absence of additional electrolytic steps simplifies methods of making metal foil as well as simplifying the fabrication of laminates for printed circuit boards.

The metal foils treated in accordance with the present invention can be bonded to dielectric substrates to provide dimensional and structural stability thereto. The treated metal foils of the invention enhance the bond or peel strength between the treated metal foil and the dielectric substrate. An advantage of the treated metal foils is that these foils can avoid added copper treatment surface roughening, or other electrolytic treatments, yet exhibit effective bond or peel strength with dielectric substrates. These foils can have a standard profile surface, low-profile surface and even a very low-profile surface, and yet provide the desired peel strength. With the inventive foils, either the matte side or shiny side can be effectively bonded to a dielectric substrate.

Useful dielectric substrates may be prepared by impregnating woven glass reinforcement materials with partially cured resins, usually epoxy resins (e.g., difunctional, tetrafunctional and multifunctional epoxies). Other useful resins include amino type resins produced from the reaction of formaldehyde and urea or formaldehyde and melamine, polyesters, phenolics, silicones, polyamides, polyimides, di-allyl phthalates, phenylsilanes, polybenizimidazoles, diphenyloxides, polytetrafluoroethylenes, cyanate esters, and the like. These dielectric substrates are sometimes referred to as prepregs.

In preparing the laminates, it is useful for both the prepreg material and the metal foil to be provided in the form of long webs of material rolled up in rolls. In one embodiment these long webs of metal foil and prepreg are laminated using a continuous process. In this process a continuous web of the treated metal foil with an adhesion promoting layer adhered thereto is brought into contact with a continuous web of prepreg material under laminating conditions to form a laminate structure. This laminate structure is then cut into rectangular sheets and the rectangular sheets are then laid-up or assembled in stacks of assemblages.

In one embodiment the long webs of treated metal foil and prepreg material are first cut into rectangular sheets and then subjected to lamination. In this process rectangular sheets of the treated metal foil and rectangular sheets of the prepreg material are then laid-up or assembled in stacks of assemblages.

Each assemblage may comprise a prepreg sheet with a sheet of treated metal foil on either side thereof, and in each instance, the side (or one of the sides) of the treated metal foil is positioned adjacent the prepreg. The assemblage may be subjected to conventional laminating temperatures and pressures between the plates of laminating presses to prepare laminates comprising sandwiches of a sheet of prepreg between sheets of treated metal foil.

The prepregs may consist of a woven glass reinforcement fabric impregnated with a partially cured two-stage resin. By application of heat and pressure, the copper foil is pressed tightly against the prepreg and the temperature to which the assemblage is subjected activates the resin to cause curing, that is crosslinking of the resin and thus tight bonding of the foil to the prepreg dielectric substrate. Generally speaking, the laminating operation will involve pressures in the range of from about 250 to about 750 psi, temperatures in the range of from about 175° C. to 235° C. and a laminating cycle of from about 40 minutes to about 2 hours. The finished laminate may then be utilized to prepare printed circuit boards (PCB).

In one embodiment, the laminate is subjected to a subtractive copper etching process to form electrically conductive lines or an electrically conductive pattern as part of a process for making a multilayered circuit board. A second treatment is then conducted over the etched pattern using the techniques discussed above and then a second prepreg is adhered to the etched pattern; the second treated metal foil surface being positioned between and adhered to both the etched pattern and the second prepreg. The techniques for making multilayered circuit boards are well known in the art. Similarly, subtractive etching processes are well known, an example of which is disclosed in U.S. Pat. No. 5,017,271, which is incorporated herein by reference.

A number of manufacturing methods are available for preparing PCBs from laminates. Additionally, there is a myriad of possible end use applications including radios, televisions, computers, etc., for the PCB's. These methods and end uses are known in the art.

One advantage resulting from the present invention is that the treated metal foils obtainable in accordance with the invention exhibit high peel strength when incorporated into a laminate. This is because the inventive method permits the treated metal foil to maintain structural integrity during processing of the treated metal foil. Another advantage is that the treated metal foil exhibits little or no treatment transfer when incorporated into a laminate. Yet another advantage is that the treated metal foil has increased resistance to, such as hydrochloric acid, which may contact the treated metal foil.

While not intending to be so limiting, the following examples illustrate various and novel aspects of the present invention. Unless otherwise indicated, in the following examples as well as throughout the specification and claims, all parts and percentages are by weight, all temperatures are in degrees centigrade, and all pressures are atmospheric.

EXAMPLE 1

Copper foil is immersed in a solution containing oxygen aerated deionized water containing 8.8 ppm dissolved oxygen at about 20° C. for 5 seconds. The copper foil is rinsed in deionized water. An oxide layer about 11 Å in thickness is detected on the foil. An aqueous electrolytic bath containing 2 g/l of chromium trioxide is prepared. The copper foil is placed in the bath and a current density of 15 ASF is applied for 5 seconds. The copper foil is rinsed again in deionized water. The copper foil is then immersed in an aqueous solution containing 1% v/v diaminosilane and 0.5% v/v epoxy silane, and allowed to dry.

EXAMPLE 2

Copper foil is immersed in a solution containing oxygen aerated deionized water containing 8.8 ppm dissolved oxygen at about 20° C. for 10 seconds. The copper foil is rinsed in deionized water. An oxide layer about 9 Å in thickness is detected on the foil. An aqueous electrolytic bath containing 1 g/l of chromium trioxide is prepared. The copper foil is placed in the bath and a current density of 20 ASF is applied for 18 seconds. The copper foil is rinsed again in deionized water. The copper foil is then immersed in an aqueous solution containing 1% v/v diaminosilane and allowed to dry.

EXAMPLE 3

Copper foil is immersed in a solution containing oxygen aerated deionized water containing 7.4 ppm dissolved oxygen at about 25° C. for 5 seconds. The copper foil is rinsed in deionized water. An oxide layer about 16 Å in thickness is detected on the foil. An aqueous electrolytic bath containing 3 g/l of chromium trioxide is prepared. The copper foil is placed in the bath and a current density of 15 ASF is applied for 10 seconds. The copper foil is rinsed again in deionized water. The copper foil is then immersed in an aqueous solution containing 0.5% v/v epoxy silane and allowed to dry.

EXAMPLE 4

Copper foil is immersed in a solution containing oxygen aerated deionized water containing 7.4 ppm dissolved oxygen at about 15° C. for 10 seconds. The copper foil is rinsed in deionized water. An oxide layer about 5 Å in thickness is detected on the foil. An aqueous electrolytic bath containing 3 g/l of chromium trioxide is prepared. The copper foil is placed in the bath and a current density of 15 ASF is applied for 10 seconds. The copper foil is rinsed again in deionized water. The copper foil is then immersed in an aqueous solution containing 0.5% v/v epoxy silane and allowed to dry.

EXAMPLE 5

Copper foil is immersed in a solution containing oxygen aerated deionized water containing 7.4 ppm dissolved oxygen at about 15° C. for 15 seconds. The copper foil is rinsed in deionized water. An oxide layer about 8 Å in thickness is detected on the foil. An aqueous electrolytic bath containing 3 g/l of chromium trioxide is prepared. The copper foil is placed in the bath and a current density of 15 ASF is applied for 10 seconds. The copper foil is rinsed again in deionized water. The copper foil is then immersed in an aqueous solution containing 0.5% v/v epoxy silane and allowed to dry.

EXAMPLE 6

Copper foil is immersed in a solution containing oxygen aerated deionized water containing 10 ppm dissolved oxygen at about 18° C. for 5 seconds. The copper foil is rinsed in deionized water. An oxide layer about 9 Å in thickness is detected on the foil. An aqueous electrolytic bath containing 4 g/l of chromium trioxide is prepared. The copper foil is placed in the bath and a current density of 15 ASF is applied for 5 seconds. The copper foil is rinsed again in deionized water. The copper foil is then immersed in an aqueous solution containing 3% v/v diaminosilane and allowed to dry.

EXAMPLE 7

Copper foil having a brass stabilization layer is immersed in a solution containing oxygen aerated deionized water containing 10 ppm dissolved oxygen at about 18° C. for 10 seconds. The multilayer metal foil is rinsed in deionized water. An oxide layer about 6 Å in thickness is detected on the foil. An aqueous electrolytic bath containing 0.5 g/l of chromium trioxide is prepared. The multilayer metal foil is placed in the bath and a current density of 25 ASF is applied for 3 seconds. The multilayer metal foil is rinsed again in deionized water. The multilayer metal foil is then immersed in an aqueous solution containing 2% 3-glycidoxypropyltrimethoxysilane and allowed to dry.

EXAMPLE 8

Nickel foil is immersed in a solution containing oxygen aerated deionized water containing 10 ppm dissolved oxygen at about 18° C. for 15 seconds. The nickel foil is rinsed in deionized water. An oxide layer about 7 Å in thickness is detected on the foil. An aqueous electrolytic bath containing 3 g/l of chromium trioxide is prepared. The nickel foil is placed in the bath and a current density of 15 ASF is applied for 10 seconds. The nickel foil is rinsed again in deionized water. The nickel foil is then immersed in an aqueous solution containing 1% v/v N-[3-(triethoxysilyl)propyl]-4,5-dihydroimidazole and 1% v/v tetraethoxysilane and allowed to dry.

While the invention has been explained in relation to its preferred embodiments, it is to be understood that various methods thereof will become apparent to those skilled in the art upon reading this specification. Therefore, it is to be understood that the invention disclosed herein is intended to cover such modifications falling within the scope of the appended claims.

What is claimed is:

1. A method of treating metal foil comprising sequentially:

contacting the metal foil with a metal foil oxidizer solution comprising water and at least about 7 ppm dissolved oxygen;

contacting the metal foil with a chromium containing electrolyte bath and electrolyzing the bath, wherein the bath contains about 0.1 to about 5 g/l of a chromium compound; and immersing the metal foil in a silane solution comprising from about 0.1 to about 10% v/v of a silane compound, with the proviso that the metal foil is not contacted with a reducing agent after contact with the metal foil oxidizer solution.

2. The method of claim 1, wherein the metal foil oxidizer solution comprises deionized water and about 8 ppm to about 20 ppm dissolved oxygen.

3. The method of claim 1, wherein the metal foil oxidizer solution comprises deionized water and about 9 ppm to about 15 ppm dissolved oxygen.

4. The method of claim 1, wherein the metal foil oxidizer solution is at a temperature from about 2° C. to about 50° C.

5. The method of claim 1, wherein the metal foil is contacted with the metal foil oxidizer solution for a period of time from about 1 to about 100 seconds.

6. The method of claim 1, wherein the metal foil oxidizer solution is at a temperature from about 10° C. to about 40° C. and the metal foil is contacted with the metal foil oxidizer solution for a period of time from about 5 to about 25 seconds.

7. The method of claim 1, wherein the chromium compound is chromium oxide.

8. The method of claim 1, wherein the chromium containing electrolytic bath further comprises at least one of a zinc compound or a phosphorus compound.

9. The method of claim 1, wherein the metal foil is copper foil.

10. A method of treating metal foil comprising sequentially:

immersing the metal foil in a metal foil oxidizer solution comprising deionized water and at least about 7.5 ppm dissolved oxygen;

optionally rinsing the metal foil;

contacting the metal foil with a chromium containing electrolytic bath and electrolyzing the bath, wherein the bath contains about 1 to 3 g/l of a chromium compound; and immersing the metal foil in a silane solution comprising about 0.1 to about 5% v/v of a silane compound, with the proviso that the metal foil is not contacted with a reducing agent after contact with the metal foil oxidizer solution.

11. The method of claim 10, wherein the metal foil oxidizer solution comprises oxygen aerated deionized water and about 8 ppm to about 20 ppm dissolved oxygen.

12. The method of claim 10, wherein the metal foil oxidizer solution comprises oxygen aerated deionized water and about 9 ppm to about 15 ppm dissolved oxygen.

13. The method of claim 10 further comprising contacting the metal foil with an acidic solution and optionally rinsing the metal foil prior to contact with the metal foil oxidizer solution.

14. The method of claim 10, with the further proviso that the metal foil is characterized by an absence of a metal layer containing zinc.

15. The method of claim 10, wherein the metal foil is copper foil.

16. A method of enhancing adhesion between copper foil and a dielectric substrate comprising sequentially:

contacting the copper foil with a metal foil oxidizer solution comprising water and from about 8 ppm to about 20 ppm dissolved oxygen thereby forming an oxide layer on the copper foil;

contacting the copper foil with a chromium containing electrolytic bath and electrolyzing the bath thereby forming a chromium containing layer over the oxide layer, wherein the bath contains about 1 to about 3 g/l of a chromium compound; and contacting the copper foil with a silane solution comprising about 0.1 to about 5% v/v of a silane compound thereby forming a silane containing layer over the chromium containing layer, with the proviso that the copper foil is not contacted with a reducing agent after contact with the metal foil oxidizer solution.

17. The method of claim 16, wherein the oxide layer has a thickness from about 1 to about 25 Å.

18. The method of claim 16, wherein the metal foil oxidizer solution is at a temperature from about 15° C. to about 30° C. and the copper foil is contacted with the metal foil oxidizer solution for a period of time from about 2 to about 50 seconds.

19. The method of claim 16, wherein the oxide layer has a thickness less than about 15 Å.

20. The method of claim 16, wherein the chromium compound is chromium oxide.

* * * * *